United States Patent [19]

Sauvage

[11] Patent Number: 5,347,182

[45] Date of Patent: Sep. 13, 1994

[54] DEVICE FOR INDICATING THAT AN OPTIONAL COMPONENT IS MOUNTED ON A BOARD

[75] Inventor: Pierre Sauvage, Champ Sur Drac, France

[73] Assignee: Hewlett-Packard Company, Palo Alto, Calif.

[21] Appl. No.: 950,259

[22] Filed: Sep. 25, 1992

[30] Foreign Application Priority Data

Sep. 26, 1991 [FR] France ............... 91 12142

[51] Int. Cl.$^5$ .......................... H03K 19/003
[52] U.S. Cl. ...................... 307/465.1; 377/54; 377/56; 364/488
[58] Field of Search ............ 365/201, 200; 371/57.1; 377/54, 56; 307/296.3, 465.1; 364/488

[56] References Cited

U.S. PATENT DOCUMENTS

| | | | |
|---|---|---|---|
| 4,433,426 | 2/1984 | Forster | 377/54 |
| 4,581,740 | 4/1986 | Kinoshita | 377/54 |
| 4,692,842 | 9/1987 | Joly et al. | 361/413 |
| 4,742,433 | 5/1988 | Joly et al. | 361/412 |
| 4,800,462 | 1/1989 | Zacher et al. | 361/413 |
| 5,045,717 | 9/1991 | Moen, Jr. et al. | 307/296.3 |
| 5,202,853 | 4/1993 | Choi | 365/201 |

FOREIGN PATENT DOCUMENTS

3504560A1 8/1986 Fed. Rep. of Germany.

Primary Examiner—Timothy P. Callahan
Assistant Examiner—My. Trang Nu Ton

[57] ABSTRACT

The invention concerns a device for indicating the presence of optional components (01-04) that can be inserted on a microprocessor board, each component having a first pin (10) associated to a first contact (11) of the board connected to a first voltage corresponding to a predetermined logic state (0), the device comprising analyzing means (3) of each of the logic states present on specific lines respectively associated to the optional components. Each optional component has a specific pin (12) connected inside the component to said first pin (10) and associated to a second contact (14) of the board connected to the corresponding specific line.

13 Claims, 1 Drawing Sheet

DEVICE FOR INDICATING THAT AN OPTIONAL COMPONENT IS MOUNTED ON A BOARD

BACKGROUND OF THE INVENTION

The present invention relates to microprocessor boards, and in particular to a device for indicating that an optional component is mounted on the board.

FIG. 1 is a partial simplified diagram of a conventional microprocessor board including microprocessor 1 connected to a system bus B. The board includes various specific components (not shown), and may include optional components, for example components 01 to 04, that are selectively connected to bus B. The optional components are typically integrated circuits or boards that can be plugged into connectors of the microprocessor board. In the shown example, optional components 01 and 02 are connected to bus B while optional components 03 and 04 are not mounted on the board and are not connected to bus B, as is indicated by dashed lines.

Optional components 01-04 are respectively associated with resistors R1 to R4 and switches J1 to J4. Resistors R1-R4 and switches J1-J4 are respectively connected in series with each other between power supply terminal $V_{CC}$ and ground G. A junction between each of resistors R1-R4 and switches J1-J4 is connected to a different input of register 3, itself connected to bus B. Thus, by closing and opening switches J, the logic states of the corresponding bits of the register are modified. Microprocessor 1, at power-on, reads the states of the bits of register REG to detect which of optional components 01-04 is mounted on the microprocessor board and connected to bus B.

To indicate that components 01 and 02 are mounted on the board and connected to bus B, switches J1 and J2 are closed and the corresponding bits applied to the inputs of register REG are at a first state 0. To indicate that components 03 and 04 are not connected to bus B, switches J3 and J4 are open and the corresponding bits applied to the inputs of register REG are at a second state 1.

Switches J1 to J4 are in the form of jumpers on the board; the jumpers must be inserted or removed by an operator as a function of the optional components he adds to and removes from the board.

A drawback of this device is that an operator, who adds and/or removes an optional component to and from the board and changes the corresponding jumper J1-J4 can easily erroneously change a particular jumper because, generally, a reference numeral associated with the jumper marked on the board is difficult to see and/or the jumpers are placed very near each other and are rather inaccessible. The operator can also simply forget to change a jumper setting or may not know that this must be done. Moreover, these settings are tedious because the operator must consult a technical manual to know which jumper setting he must change when an optional component is added or removed.

SUMMARY OF THE INVENTION

An object of the invention is to provide a new and improved device for automatically indicating whether an optional component is mounted on a microprocessor board.

Another object of the invention is to provide a new and improved device for indicating whether one or more optional components is mounted on a microprocessor board, wherein the device does not need a jumper setting.

Another object of the invention is to provide a new and improved device for indicating whether one or more optional components is mounted on a microprocessor board, wherein the device occupies a relatively small surface on the microprocessor board.

According to one aspect of the invention, a microprocessor board having the capability of detecting whether an optional component is mounted on the board is provided. The optional component includes first and second terminals having an ohmic connection to them by circuitry on the optional component. The microprocessor board comprises and has mounted thereon (a) first and second contacts for respectively establishing connections to the first and second terminals of the optional component while the optional component is mounted on the board, (b) circuitry connected to the first and second contacts for respectively deriving first and second binary levels in response to the first and second contacts being connected and not connected together via the first and second terminals and the ohmic connection by the circuitry on the optional component, and (c) means for detecting the value of the binary level.

According to an embodiment of the present invention, the ohmic connection includes a resistor.

Preferably, the means for analyzing comprises a register connected to a bus for a binary level associated with the presence and absence of a plurality of the optional components.

According to another embodiment of the present invention, the optional components are integrated circuits.

BRIEF DESCRIPTION OF THE DRAWINGS

The foregoing and other objects, features and advantages of the invention are disclosed in more detail in the following description of the preferred embodiment and by referring to the attached drawings wherein.

DESCRIPTION OF THE PREFERRED EMBODIMENT

Figure 1:
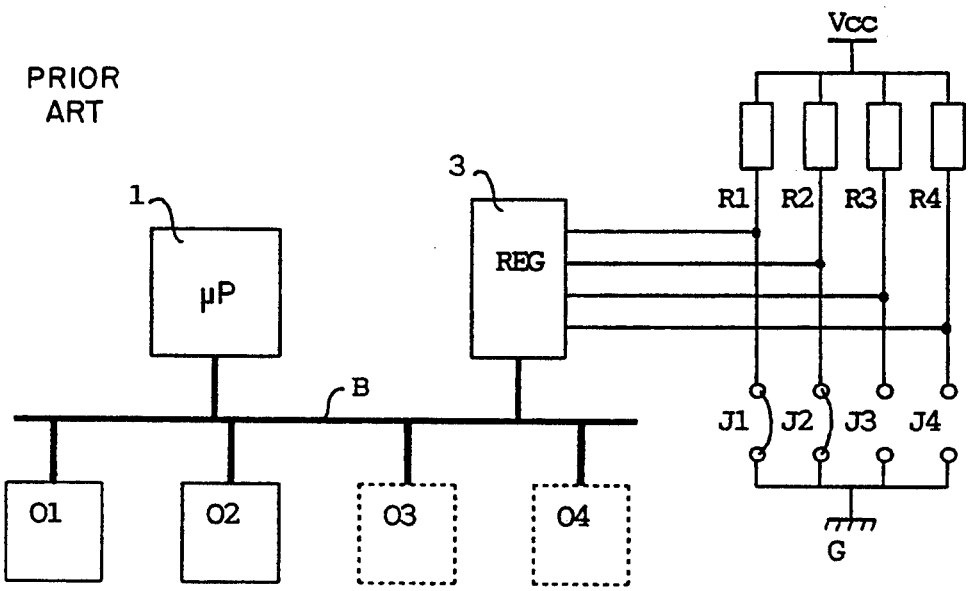
FIG. 1, previously described, is a schematic block diagram of a conventional device for indicating the connections and presence of optional components on a microprocessor board.
Figure 2:
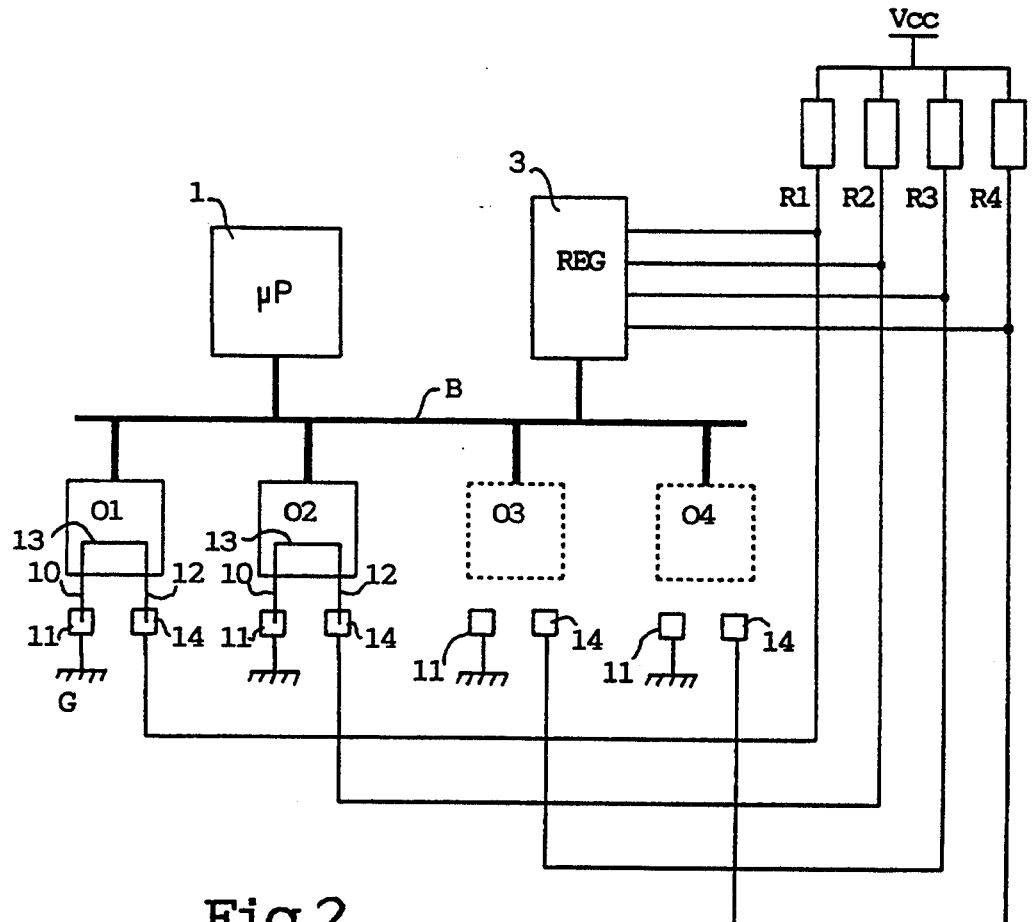
FIG. 2 is a schematic block diagram of a device according to the invention for indicating the connections and presence of optional components on a microprocessor board.

Some of the elements illustrated in FIG. 1 are included in FIG. 2 and designated by the same reference numerals. In general, each of the optional components (integrated circuits or boards) 01, 02 . . . includes at least one power supply pin (or contact) 10 which must be connected on a microprocessor board to a constant voltage, for example to ground G. Associated with each supply pin 10 is a contact 11 of the board.

According to the invention, each of optional components 01-04 includes a specific pin 12 which is connected by a connecting lead 13 internal to the component to supply pin 10. The board comprises plural contacts 14, each corresponding to one of each of specific pins 12. The terminal of each of resistors R is connected to an input of register 3 and to one of contacts 14, instead of being connected to an associated one of jumpers J1–J4. To avoid adding an extra pin to the cases of optional components 01–04, pin 12 is typically an unused pin, often available, of a conventional component.

As shown, optional components 01 and 02 are present, i.e., mounted on the microprocessor board and connected to bus B, while components 03 and 04 are absent from the board and are not connected to the bus. For an optional component 0 that is mounted on the microprocessor board, the corresponding contacts 11 and 14 are short-circuited by the internal ohmic connection of present component 0 provided by lead 13; this has the same effect as closing the associated switch J of FIG. 1. For an absent component 0, the corresponding contacts 11 and 14 are not connected to each other, which has the same effect as opening an associated switch J of FIG. 1.

As a result of the present invention, the simple insertion of an optional component indicates to the system its presence by setting the corresponding bit in register 3 as the setting of a jumper would have done conventionally. The invention thus ensures an automatic indication of the presence of optional components.

Moreover, the elimination of jumpers J1–J4 results in a substantial increase in available surface area on the board. Of course, the connections (copper tracks) between resistors R1–R4 and contacts 14 must be added to the board, but the required surface area is reduced because these connections can be very thin as the currents circulating therein are very low.

Many modifications and alternatives of the invention will appear to those skilled in the art. One particular modification is that the mentioned supply pins 11 can be connected to a high voltage supply terminal, e.g. $V_{CC}$, in which case resistors R are connected to a low voltage terminal, such as ground. The ohmic connection of internal lead 13 between pins 10 and 12 can include a resistive component.

I claim:

1. In combination, a microprocessor board having a plurality of connector means for receiving respective optional electronic components, one of said optional electronic component having (a) a plurality of electrical contact pins including a first pin and a second pin, and (b) means electrically interconnecting said first and second pins; each said connector means of the microprocessor board having a plurality of contacts including a first and a second contact for respectively making electrical contact with said first and second pins of one of said optional component upon the latter being inserted into said connector means; said microprocessor board further having:

a first voltage supply line,
 a second voltage supply line connected to the said first contact of each said connector means,
 respective biased logic-level means associated with each connector means, each said biased logic-level means having a logic-level reference point and being connected to said first supply line to establish a first voltage logic level at said reference point in the absence of said optional electronic component in the corresponding said connector means, said biased logic-level means being further connected to said second contact of the corresponding said connector means and being responsive to said second contact being connected to said second voltage supply line, through said second and first pins of said optional electronic component inserted in the corresponding said connector means, to cause a second voltage logic level to be established at said reference point replacing the said first logic level, and
 analyzing means connected to said reference point of each said connector means for determining the logic level thereat thereby to determine whether said optional component has been inserted in the corresponding said connector means.

2. The combination of claim 1, wherein said biased logic-level means comprises a respective resistor connected between each of said second contacts and said first voltage supply line.

3. The combination of claim 1, wherein said analyzing means comprises a register for storing the logic state present at the reference point of each said biased logic-level means.

4. The combination of claim 1, wherein one of said optional electronic component is an integrated circuit.

5. The combination of claim 1, wherein said means electrically interconnecting said first and second pins is a resistor.

6. In combination, a microprocessor board having a plurality of connector means for receiving respective optional electronic components, one of said component having (a) a plurality of electrical contact pins including a first pin and a second pin, and (b) means for electrically interconnecting said first and second pins; each said connector means of the microprocessor board having a plurality of contacts including a first and a second contact for respectively making electrical contact with said first and second pins of said at least one optional component upon the latter being inserted into said connector means; said microprocessor board further having:

a first voltage supply line for establishing a first voltage logic level,
 a second voltage supply line connected to said first contact of each of said connector means to establish a voltage thereon corresponding to a second voltage logic level,
 biasing means connecting said first supply line to said second contact of each of said connector means to apply thereto a voltage corresponding to said first voltage logic level, said biasing means being such that upon insertion of one of said optional components in one of said connector means, the voltage established at said first contact of the connector means is applied to said second contact overriding the voltage applied thereto by said biasing means whereby said second voltage logic level is established at said second contact, and
 analyzing means connected to the said second contact of each of said connector means for determining the logic level thereat thereby to determine whether one of said optional components has been inserted in the corresponding one of said connector means.

7. The combination of claim 6, wherein said biasing means comprises a respective resistor connected between each said second contact and said first voltage supply line.

8. A microprocessor board having the capability of detecting whether an optional component is mounted on the board, the optional component including first and second terminals having an ohmic connection to them by circuitry on the optional component, the microprocessor board comprising and having mounted thereon first and second contacts for respectively establishing connections to the first and second terminals of the optional component while the optional component is mounted on the board, circuitry connected to the first and second contacts for respectively deriving first and second binary levels in response to the first and second contacts (a) being connected together via the first and second terminals and the ohmic connection by the circuitry on the optional component and (b) not being connected together via the first and second terminals and the ohmic connection by the circuitry on the optional component, and means for detecting the value of the binary level.

9. The microprocessor board of claim 8 wherein the board has the capability of detecting whether plural (N) of said optional components are mounted on the board, each of the optional components including first and second terminals having an ohmic connection to them by circuitry on particular optional component, the microprocessor board further comprising and having mounted thereon N sets of said first and second contacts for respectively establishing connections to the first and second terminals of the optional components while said one optional component is mounted on the board, circuitry connected to the N sets first and second contacts for respectively deriving first and second binary levels for optional component i in response to the first and second contacts of set i (a) being connected together via the first and second terminals and the ohmic connection by the circuitry on the optional component i and (b) not being connected together via the first and second terminals and the ohmic connection by the circuitry on the optional component i, and means for detecting the value of each of the N binary levels, where i is selectively each of 1 . . . N.

10. The microprocessor of claim 9 wherein the board further includes and has mounted thereon (a) a bus selectively connected to further terminals of the N optional components, (b) a microprocessor connected to the bus, and (c) a register connected to the bus and being included in the means for detecting.

11. In combination, a microprocessor board having the capability of detecting whether an optional component is mounted on the board, an optional component including first and second terminals having an ohmic connection to them by circuitry on the optional component, the microprocessor board comprising and having mounted thereon (a) first and second contacts for respectively establishing connections to the first and second terminals of the optional component while the optional component is mounted on the board, (b) circuitry connected to the first and second contacts for respectively deriving first and second binary levels in response to the first and second contacts (a) being connected together via the first and second terminals and the ohmic connection by the circuitry on the optional component (b) not being connected together via the first and second terminals and the ohmic connection by the circuitry on the optional component, and (c) means for detecting the value of the binary level.

12. The combination of claim 11 wherein the board has the capability of detecting whether plural (N) of said optional components are mounted on the board, each of the optional components including first and second terminals having an ohmic connection to them by circuitry on the particular optional component, the microprocessor board further comprising and having mounted thereon N sets of said first and second contacts for respectively establishing connections to the first and second terminals of the optional components while said one optional component is mounted on the board, circuitry connected to the N sets first and second contacts for respectively deriving first and second binary levels for optional component i in response to the first and second contacts of set i (a) being connected together via the first and second terminals and the ohmic connection by the circuitry on the optional component i and (b) not being connected together via the first and second terminals and the ohmic connection by the circuitry on the optional component i, and means for detecting the value of each of the N binary levels, where i is selectively each of 1.

13. The combination of claim 12 wherein the board further includes and has mounted thereon (a) a bus selectively connected to further terminals of the N optional components, (b) a microprocessor connected to the bus, and (c) a register connected to the bus and being included in the means for detecting.

* * * * *

UNITED STATES PATENT AND TRADEMARK OFFICE
CERTIFICATE OF CORRECTION

PATENT NO. : 5,347,182
DATED : September 13, 1994
INVENTOR(S) : Pierre SAUVAGE

It is certified that error appears in the above-indentified patent and that said Letters Patent is hereby corrected as shown below:

```
Column 3, line 40, change "component" to --components--.
Column 3, line 50, change "component" to --components--.
Column 4, line 18, change "component" to --components--.
Column 4, line 24, change "component" to --components--.
Column 5, line 20, after "on" insert --a--.
```

Signed and Sealed this

Third Day of September, 1996

Attest:

BRUCE LEHMAN

Attesting Officer

Commissioner of Patents and Trademarks